US011264295B2

(12) United States Patent
Kwon et al.

(10) Patent No.: US 11,264,295 B2
(45) Date of Patent: Mar. 1, 2022

(54) INTEGRATED CIRCUIT SUBSTRATE FOR CONTAINING LIQUID ADHESIVE BLEED-OUT

(71) Applicant: Google LLC, Mountain View, CA (US)

(72) Inventors: Woon Seong Kwon, Santa Clara, CA (US); Ryohei Urata, San Carlos, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/038,878

(22) Filed: Sep. 30, 2020

(65) Prior Publication Data

US 2021/0074601 A1    Mar. 11, 2021

Related U.S. Application Data

(62) Division of application No. 16/358,203, filed on Mar. 19, 2019, now Pat. No. 10,818,567.
(Continued)

(51) Int. Cl.
*H01L 23/495* (2006.01)
*H01L 23/29* (2006.01)
(Continued)

(52) U.S. Cl.
CPC .......... *H01L 23/293* (2013.01); *H01L 21/563* (2013.01); *H01L 23/3185* (2013.01);
(Continued)

(58) Field of Classification Search
CPC ..... H01L 2224/2919; H01L 2924/0665; H01L 21/481; H01L 21/563; H01L 2224/16145;
(Continued)

(56) References Cited

U.S. PATENT DOCUMENTS 10,079,224 B2    9/2018 Das et al.
2010/0244219 A1    9/2010 Pagaila et al.
(Continued)

FOREIGN PATENT DOCUMENTS

JP        S6380849 U     5/1988
JP        H01241828 A    9/1989
(Continued)

OTHER PUBLICATIONS

Invitation to Pay Additional Fees for International Application No. PCT/US2019/060916 dated Mar. 4, 2020. 17 pages.
(Continued)

*Primary Examiner* — Theresa T Doan
(74) *Attorney, Agent, or Firm* — Lerner, David, Littenberg, Krumholz & Mentlik, LLP

(57) ABSTRACT

Integrated circuit substrates having features for containing liquid adhesive, and methods for fabricating such substrates, are provided. A device can include a first substrate layer and a second substrate layer adhered to the first substrate layer such that a portion of the top surface of the first substrate layer is exposed to define a bottom of a cavity, and an edge of the second substrate layer adjacent to the exposed top surface of the first substrate layer defines an edge of the cavity. The device can include an integrated circuit die adhered to the exposed top surface of first substrate layer with a liquid adhesive. The first substrate layer can define a trench in the bottom of the cavity between a region of the integrated circuit die and the edge of the cavity such that the trench can receive bleed-out of the liquid adhesive from between the integrated circuit die and the top surface of the first substrate layer.

10 Claims, 6 Drawing Sheets

Related U.S. Application Data

(60) Provisional application No. 62/776,681, filed on Dec. 7, 2018.

(51) Int. Cl.

| | | |
|---|---|---|
| *H01L 23/31* | (2006.01) | |
| *H01L 23/498* | (2006.01) | |
| *H01L 25/065* | (2006.01) | |
| *H01L 23/00* | (2006.01) | |
| *H01L 21/56* | (2006.01) | |
| *H01L 23/538* | (2006.01) | |

(52) U.S. Cl.
CPC .. *H01L 23/49811* (2013.01); *H01L 23/49822* (2013.01); *H01L 23/5381* (2013.01); *H01L 24/16* (2013.01); *H01L 25/0655* (2013.01); *H01L 2224/16225* (2013.01)

(58) Field of Classification Search
CPC . H01L 2224/16225; H01L 2224/26175; H01L 2224/32225; H01L 2224/73253; H01L 2224/83855; H01L 23/13; H01L 23/293; H01L 23/3185; H01L 23/49822; H01L 24/13; H01L 24/16; H01L 24/29; H01L 24/32; H01L 24/83; H01L 2924/14
USPC ........................................................ 257/668
See application file for complete search history.

(56) References Cited

U.S. PATENT DOCUMENTS

| | | | |
|---|---|---|---|
| 2011/0180908 A1* | 7/2011 | Naganuma | H05K 1/0298 |
| | | | 257/621 |
| 2012/0153504 A1 | 6/2012 | Arana et al. | |
| 2018/0045885 A1 | 2/2018 | Canali et al. | |

FOREIGN PATENT DOCUMENTS

| | | |
|---|---|---|
| JP | H0215728 U | 1/1990 |
| TW | 200945456 A | 11/2009 |
| TW | 201230904 A | 7/2012 |
| TW | 201620815 A | 6/2016 |

OTHER PUBLICATIONS

Office Action for Taiwanese Patent Application No. 108143592 dated Mar. 23, 2020. 8 pages. (last page categorizing the cited references).

International Preliminary Report on Patentability for International Application No. PCT/US2019/060916 dated Jun. 24, 2020. 21 pages.

International Preliminary Report on Patentability for International Application No. PCT/US2019/060916 dated Jun. 17, 2021. 13 pages.

Office Action for Taiwanese Patent Application No. 108143592 dated Oct. 20, 2020. 4 pages.

Office Action for Taiwanese Patent Application No. 108143592 dated Sep. 22, 2021. 12 pages.

\* cited by examiner

INTEGRATED CIRCUIT SUBSTRATE FOR CONTAINING LIQUID ADHESIVE BLEED-OUT

CROSS REFERENCE TO RELATED APPLICATION

The present application is a divisional of U.S. patent application Ser. No. 16/358,203, filed on Mar. 19, 2019 which claims the benefit of the filing date of U.S. Provisional Patent Application No. 62/776,681 filed Dec. 7, 2018, all of which are incorporated herein by reference.

BACKGROUND

Certain integrated devices can be fabricated by bonding an integrated circuit in a cavity of a substrate. The cavity can be formed by joining two substrate layers with an adhesive, and then cutting away a portion of one layer. In some cases, additional components can be bonded across both a top surface of the substrate and a top surface of the integrated circuit.

SUMMARY

At least one aspect is directed to a device including a first substrate layer having a top surface and a bottom surface. The device includes a second substrate layer having a bottom surface adhered to a first portion of the top surface of the first substrate layer such that a second portion of the top surface of the first substrate layer is exposed to define a bottom of a cavity, and n edge of the second substrate layer adjacent to the exposed top surface of the first substrate layer defines an edge of the cavity. The device includes an integrated circuit die adhered to the exposed top surface of first substrate layer with a liquid adhesive. The first substrate layer defines a trench in the bottom of the cavity between a region of the integrated circuit die and the edge of the cavity such that the trench can receive bleed-out of the liquid adhesive from between the integrated circuit die and the top surface of the first substrate layer.

At least one aspect is directed to a method of fabricating a device. The method includes providing a first substrate layer having a top surface and a bottom surface. The method includes adhering a bottom surface of a second substrate layer to the top surface of the first substrate layer. The method includes removing a portion of the second substrate layer to expose a portion of the top surface of the first substrate layer. The method includes cutting a trench into the exposed portion of the top surface of the first substrate layer. The method includes adhering an integrated circuit die onto the exposed top surface of the first substrate layer with a liquid adhesive such that the trench receives bleed-out of the liquid adhesive from between the integrated circuit die and the top surface of the first substrate layer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1:
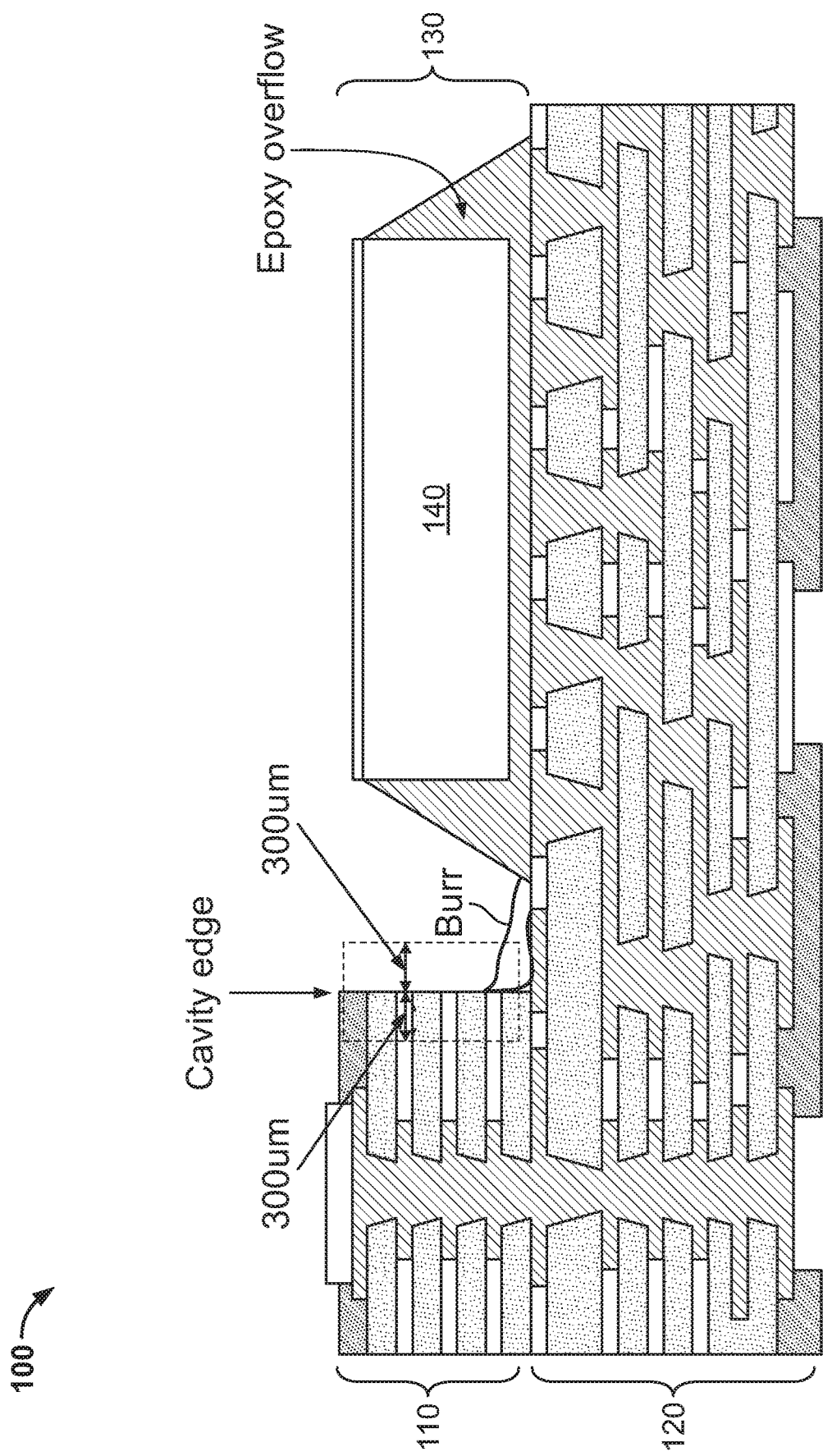
FIG. 1 illustrates an integrated device having an integrated circuit die mounted in a cavity of a substrate with a burr and regions of liquid adhesive overflow.

This disclosure generally relates to an integrated circuit substrate for containing liquid adhesive bleed-out and a method for fabricating the same. Certain integrated devices can be fabricated by bonding an integrated circuit in a cavity of a substrate. The cavity can be formed by joining two substrate layers with an adhesive, and then cutting away a portion of the second layer. The cutting can be performed by a laser. During the cutting, the laser may scorch or otherwise degrade the adhesive, which is typically an organic compound. The burned adhesive may form burrs. These burrs may interfere with placement of the integrated circuit die within the cavity. The burr may get caught underneath the die, preventing the die from seating properly. The die may be tilted and thus have uneven contact with the cavity surface. In extreme cases, the burr may cause a gap to form between the die and the substrate. The gap can be vulnerable to particle contamination due to dust in air circulating in the vicinity of the integrated device.

The die can be bonded to the substrate using an epoxy or other liquid adhesive. In high-volume production, it may be difficult to control the amount of liquid adhesive used to bond the die to the substrate. Too little liquid adhesive may result in a poorly bonded device vulnerable to mechanical failures. Too much liquid adhesive, however, may contaminate surfaces of the die and/or the substrate that need to remain clear following the bonding steps. Too much liquid adhesive may also create a large fillet that may interfere with the placement of other components in the cavity or otherwise in the vicinity of the die.

The following disclosure proposes a solution to one or both of the dual problems of burrs and liquid adhesive bleed-out. One or more trenches can be machined, etched, or otherwise cut into the floor of the cavity; i.e., into a surface of the first substrate layer. The one or more trenches can be formed in a region outside a perimeter of the die, within the perimeter of the die, or straddling the perimeter of the die. The trench can be formed in the first substrate layer following formation of the cavity. In some cases the cutting of the trench itself may remove any burrs that could have interfered with placement and bonding of the die. In some implementations, any burrs remaining following the trench-cutting steps may be pushed into the trench and thus prevented from interfering with the placement of the die. Moreover, the one or more trenches can provide an overflow region for excess liquid adhesive. The one or more trenches can divert and collect excess liquid adhesive, and prevent the excess liquid adhesive from fouling or otherwise obscuring surfaces of the die or substrate that need to remain clear following the die bonding steps. The one or more trenches can also prevent the fillet from extending too far from the perimeter of the die and obstructing components that need to be placed adjacent to the die. In this manner, two dies can be placed in closer proximity than previously possible without the trench features while still allowing for liquid adhesive volume tolerance variations typical of high production volume processes.

FIG. 1 illustrates an integrated device 100 having an integrated circuit die 140 mounted in a cavity 130 of a substrate 110 and 120 with a burr and regions of liquid adhesive overflow. The finished substrate shown in the device 100 includes a first substrate layer 120 and a second substrate layer 110. The second substrate layer 110 is adhered to the first substrate layer 120 with an adhesive. Typically, the adhesive is an organic compound. A portion of the second substrate layer 110 is either absent or removed to expose a portion of a top surface of the first substrate layer 120 and define the cavity 130. In a typical process, the portion of the second substrate layer 110 is removed by cutting through the second substrate layer with a cutting laser. During the cutting process, the laser may scorch, burn, or otherwise affect the adhesive in a manner that can produce debris in the form of burrs. In some cases, the burrs can interfere with subsequent fabrication steps, such as adhering the integrated circuit die 140 to the substrate. For example, a burr may get lodged underneath the integrated circuit die 140 and prevent it from seating properly; that is, cause it to mount with a tilt. The tilt may cause problems for mounting additional components to the integrated circuit die 140, including components that may be mounted in a manner that spans both the integrated circuit die 140 and a top surface of the second substrate layer 110. The tilt may also result in voids between the integrated circuit die 140 and the substrate. The voids can become contaminated later in the fabrication process or following deployment of the device 100. For example, the void may fill with dust or other contaminants in a manner that detrimentally affects operation of the device 100, such as reducing performance or causing intermittent or early an unrepairable failures.

Typically, the integrated circuit die 140 is adhered to the exposed top surface of the first substrate layer 120 with a liquid adhesive, which may be an epoxy. In a mass-production or high-volume production environment, the amount of liquid adhesive used will vary within a tolerance range. The nominal amount of liquid adhesive used may be set to make sure that even at the low end of the tolerance range, enough is used to create an adequate bond. At the high end of the tolerance range, however, the device 100 may experience bleed-out or overflow of the liquid adhesive out from under the integrated circuit die 140. The bleed-out can cause various problems, such as fouling or obscuring regions of the device 100 that need to remain exposed during subsequent fabrication steps and/or after deployment. In addition, the bleed-out, once hardened can obstruct placement of other components adjacent to the integrated circuit die 140. For example, in some devices, a second integrated circuit die may be placed close to the first integrated circuit die 140 such that the two can be connected. The nature of the connection or of the shared functions between the two dies may require close proximity between them, a close proximity that may be prevented by a fillet or blob of hardened/cured liquid adhesive extending an excessive distance away from the first integrated circuit die 140.

Accordingly, this disclosure describes creating trench features in the exposed top surface of the first substrate layer 120. The trenches can receive burrs caused by cutting the second substrate layer 110; and, in some cases, the act of cutting of the trenches itself may remove burrs before they can interfere with subsequent fabrication steps. The trenches can also receive liquid adhesive bleed-out and prevent excessive bleed-out from fouling the device 100 or obstructing the placement of additional components.

Figure 2:
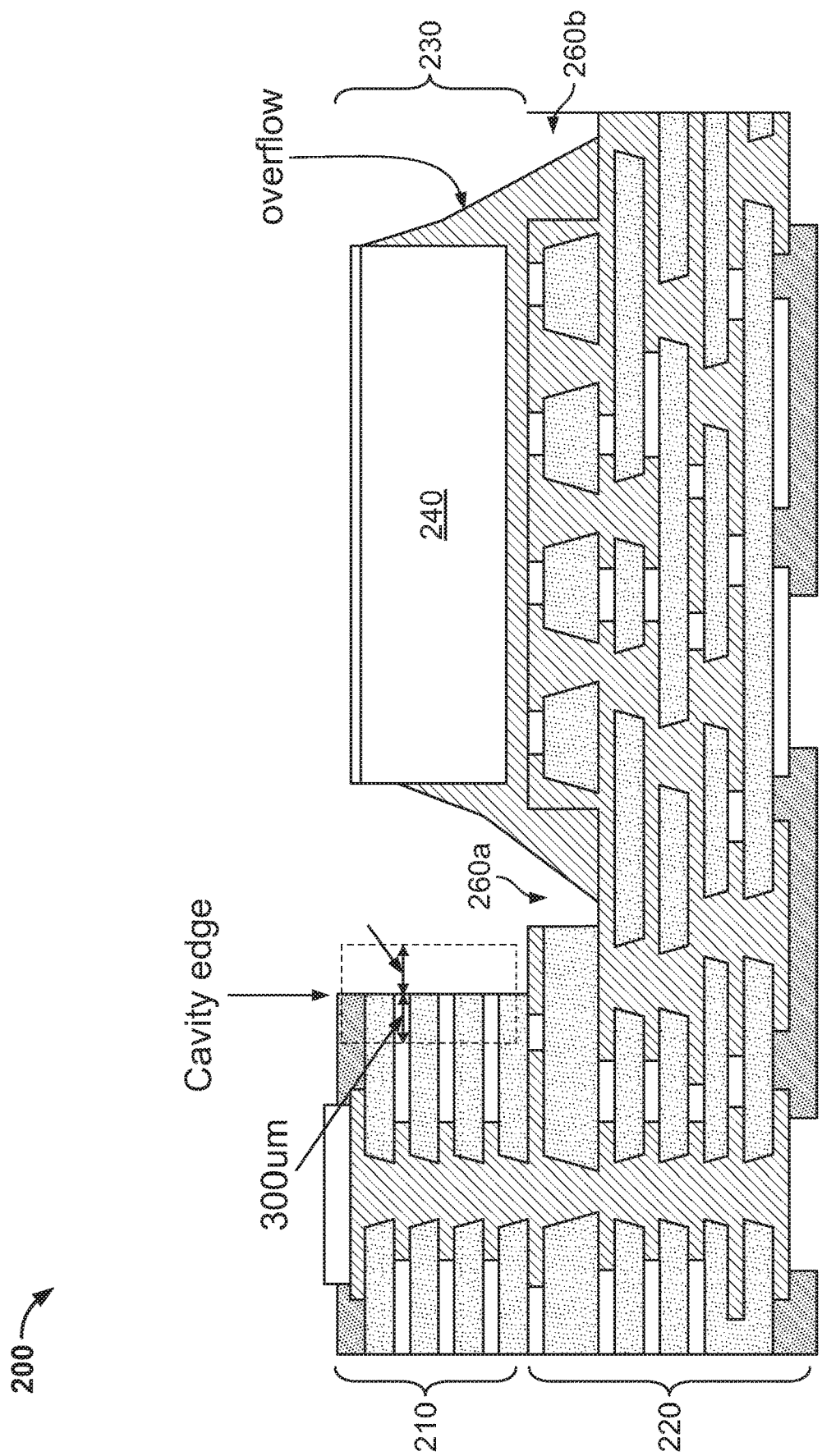
FIG. 2 illustrates a first example integrated device having an integrated circuit die mounted in a cavity of a substrate with trenches outside the perimeter of the integrated circuit for containing liquid adhesive bleed-out.

FIG. 2 illustrates a first example integrated device 200 having an integrated circuit die 240 mounted in a cavity 230 of a substrate 210 and 220 with trenches 260a and 260b outside the perimeter of the integrated circuit die for containing liquid adhesive bleed-out. The device 200 includes a first substrate layer 220 and a second substrate layer 210. A portion of the second substrate layer 210 has been removed to expose a portion of a top surface of the first substrate layer 220 and define the cavity 230. The trenches 260a and 260b (collectively "trenches 260") have been cut, etched, machined, or otherwise defined into the top surface of the first substrate layer 220 in a region near the intended position of the integrated circuit die 240. The trenches 260 can be configured to receive any burrs or other debris left over from the process of cutting the second substrate layer 210. In some cases, the process of cutting the trenches 260 can remove debris proactively. In addition, the trenches 260 can be configured to receive any bleed-out of a liquid adhesive used to adhere the integrated circuit die 240 to the exposed top surface of the first substrate layer 220.

In the device 200 shown in FIG. 2, the trenches 260 are shown positioned outside of a perimeter of the integrated circuit die 240. In some implementations, the trenches 260 can be defined such that they align with the perimeter of the integrated circuit die 240, extend across the perimeter of the integrated circuit die 240, or lie completely within the perimeter of the integrated circuit die 240.

Figure 3:
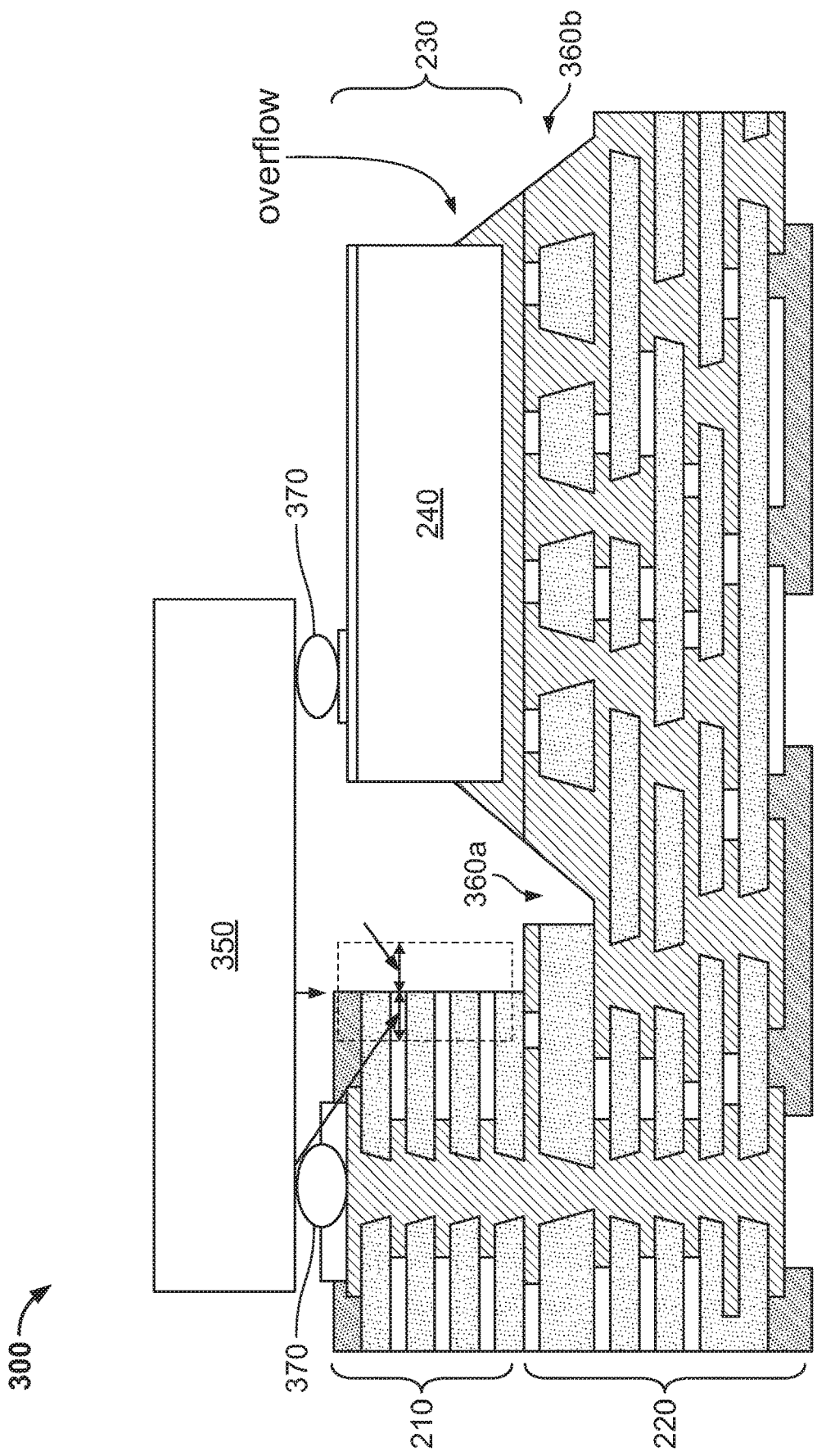
FIG. 3 illustrates a second example integrated device having an integrated circuit die mounted in a cavity of a substrate with trenches aligned with a perimeter of the integrated circuit die for containing liquid adhesive bleed-out, and additionally having a bridge die mounted over the integrated circuit die and substrate.

FIG. 3 illustrates a second example integrated device 300 having an integrated circuit die 240 mounted in a cavity 230 of a substrate 220 and 210 with trenches 360a and 360b aligned with a perimeter of the integrated circuit die 240 for containing liquid adhesive bleed-out, and additionally having a bridge die 350 mounted over the integrated circuit die 240 and substrate 220 and 210. The first substrate layer 220, second substrate layer 210, cavity 230, and integrated circuit die 240 can be similar to the corresponding features of the device 200 previously described. In the device 300, the trenches 360a and 360b (collectively "trenches 360") are aligned with the perimeter of the integrated circuit die 240. The device 300 additionally has a bridge die 350 mounted across the first substrate layer and the integrated circuit die 240. The bridge die 350 can have solder balls 370 for mechanically and electrically coupling the bridge die 350 to the second substrate layer and the integrated circuit die 240. In the device 300, the trenches 360 can prevent a burr from interfering with proper placement of the integrated circuit die 240, which could result in a tilt that could prevent proper positioning of the bridge die 350. The trenches 360 can further prevent bleed-out of the liquid adhesive from fouling a region between the integrated circuit die 240 and an edge of the second adhesive layer 210 in a manner that could interfere with placement of the bridge die 350.

Figure 4:
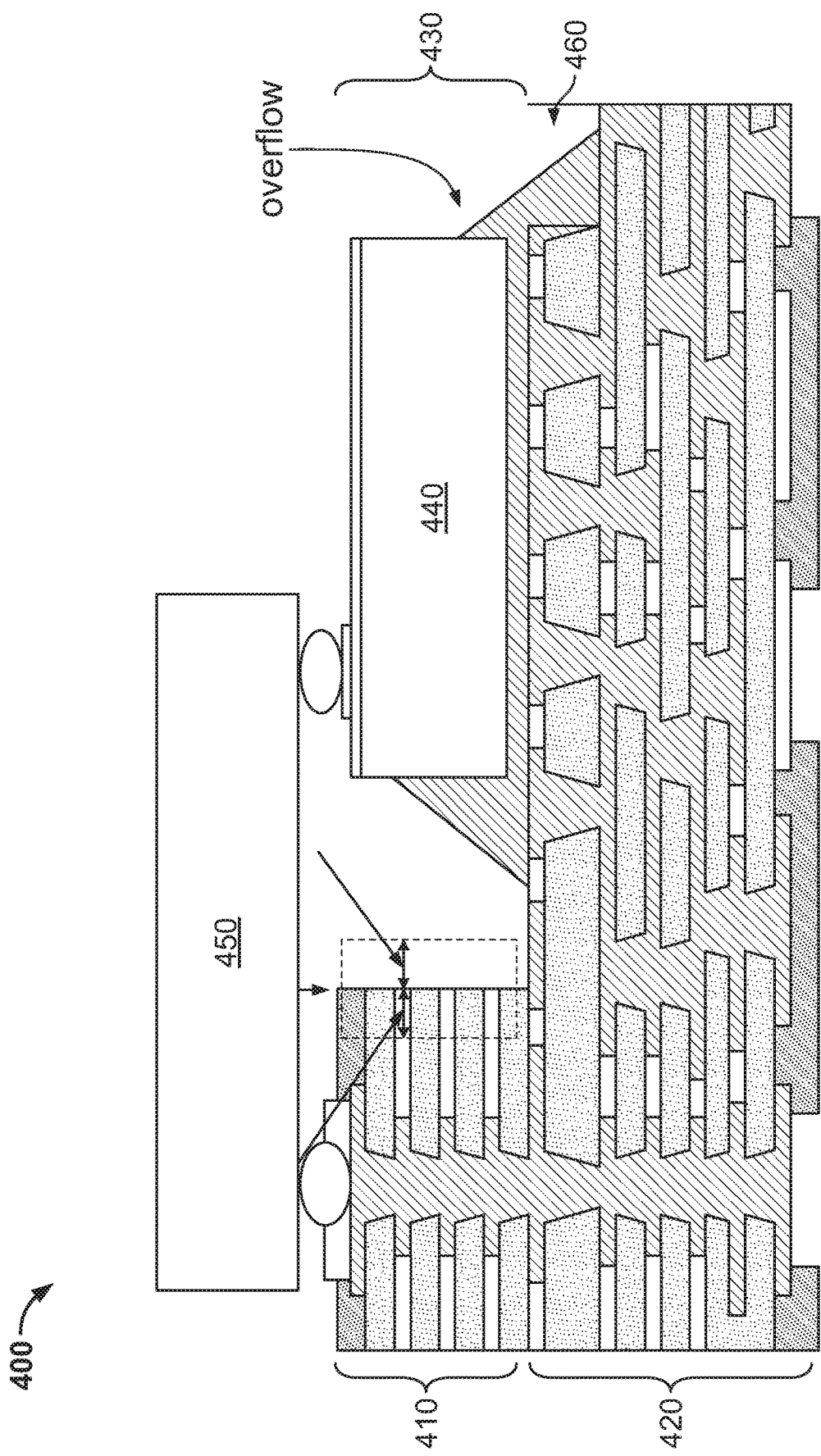
FIG. 4 illustrates a third example integrated device having an integrated circuit die mounted in a cavity of a substrate with a trench slightly incut from a perimeter of the integrated circuit die for containing liquid adhesive bleed-out.
Figure 5:
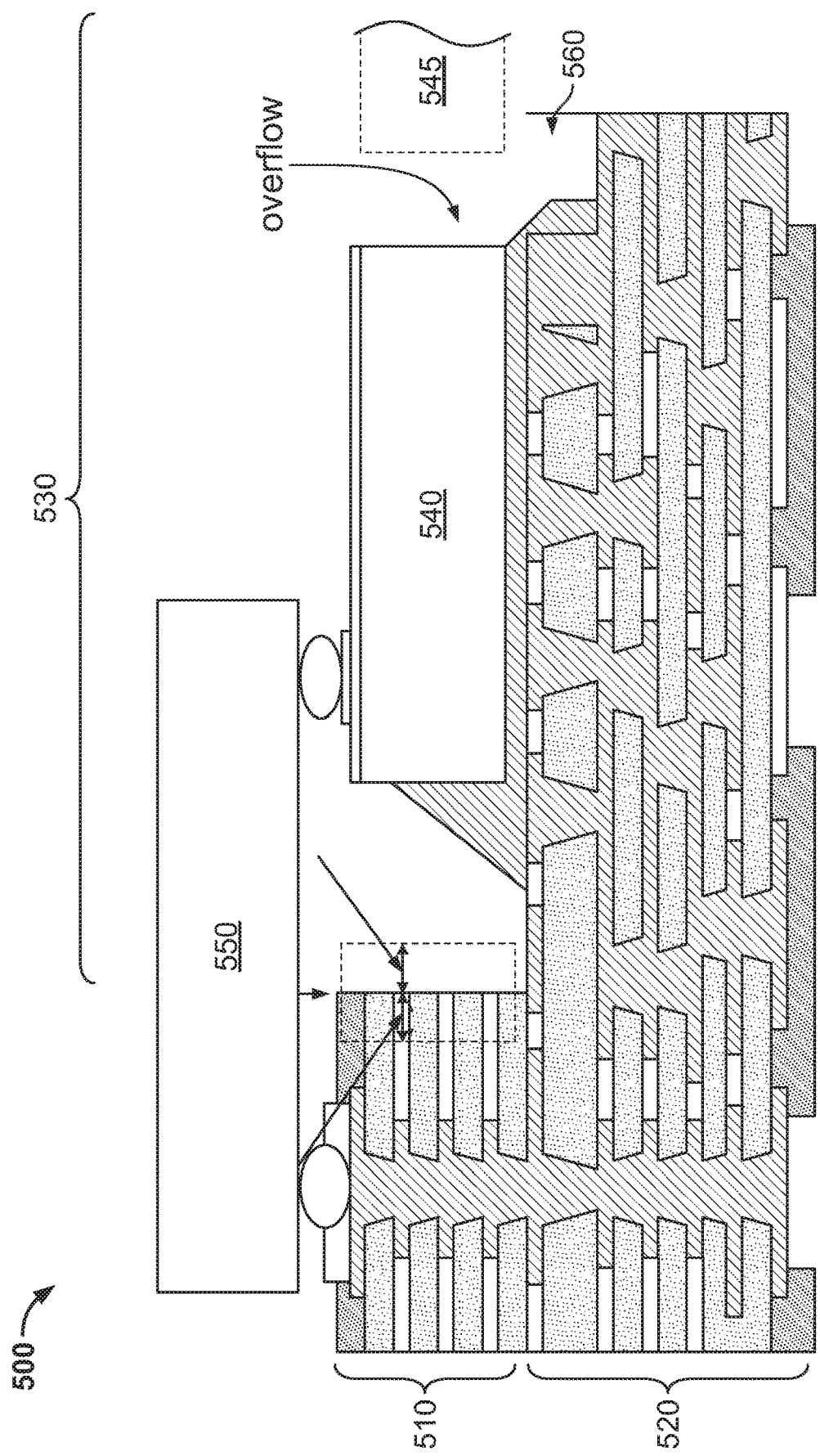
FIG. 5 illustrates a fourth example integrated device having a first integrated circuit die mounted in a cavity of a substrate with a trench straddling a perimeter of the first integrated circuit die for containing liquid adhesive bleed-out, and an optional second integrated circuit die mounted adjacent to the first integrated circuit die.

FIG. 4 illustrates a third example integrated device 400 having an integrated circuit die 440 mounted in a cavity 430 of a substrate 420 and 410 with a trench 460 slightly incut from a perimeter of the integrated circuit die 440 for containing liquid adhesive bleed-out. The first substrate layer 420, second substrate layer 410, cavity 430, integrated circuit die 440, and bridge die 450 can be similar to the first substrate layer 220, second substrate layer 210, cavity 230, integrated circuit die 240, and bridge die 350, respectively of the device 300 previously described. In the device 400, the trench 460 extends across the perimeter of the integrated circuit die 440; i.e., the trench 460 is slightly incut from the edge of the integrated circuit die 440. A slightly incut trench can further reduce the extent of the fillet of the liquid adhesive bleed-out from the side of the integrated circuit device 440 and avoid any interference with additional components that need to be positioned adjacent to the integrated circuit device 440. FIG. 5 below illustrates the placement of such an adjacent component.

FIG. 5 illustrates a fourth example integrated device 500 having an integrated circuit die 540 mounted in a cavity 530 of a substrate 520 and 510 with a trench 560 straddling a perimeter of the integrated circuit die 540 for containing liquid adhesive bleed-out. The first substrate layer 520, second substrate layer 510, cavity 530, integrated circuit die 540, and bridge die 550 can be similar to the first substrate layer 220, second substrate layer 210, cavity 230, integrated circuit die 240, and bridge die 350, respectively of the device 300 previously described. In the device 500, the trench 560 extends across the perimeter of the integrated circuit die 540; i.e., the trench 460 straddles the edge of the integrated circuit die 440. The position of the trench 560 relative to the edge of the integrated circuit die 540 can reduce the extent of the fillet of the liquid adhesive bleed-out from the side of the integrated circuit device 540 and prevent interference with an additional component that needs to be positioned adjacent to the integrated circuit device 540, such as the second integrated circuit die 545. In the device 550, the trench 560 can be positioned such that it straddles the perimeters of both integrated circuit dies 540 and 545. The trench 560 can therefore receive any liquid adhesive bleed-out from either or both of the integrated circuit dies 540 and 545. The trench 560 can thus prevent excess liquid adhesive from fouling the region between (or, in some cases, above) the integrated circuit dies 540 and 545. Accordingly, excess liquid adhesive can be prevented from interfering with any interconnects or additional components that may need to be positioned across or between the integrated circuit dies 540 and 545.

Figure 6:
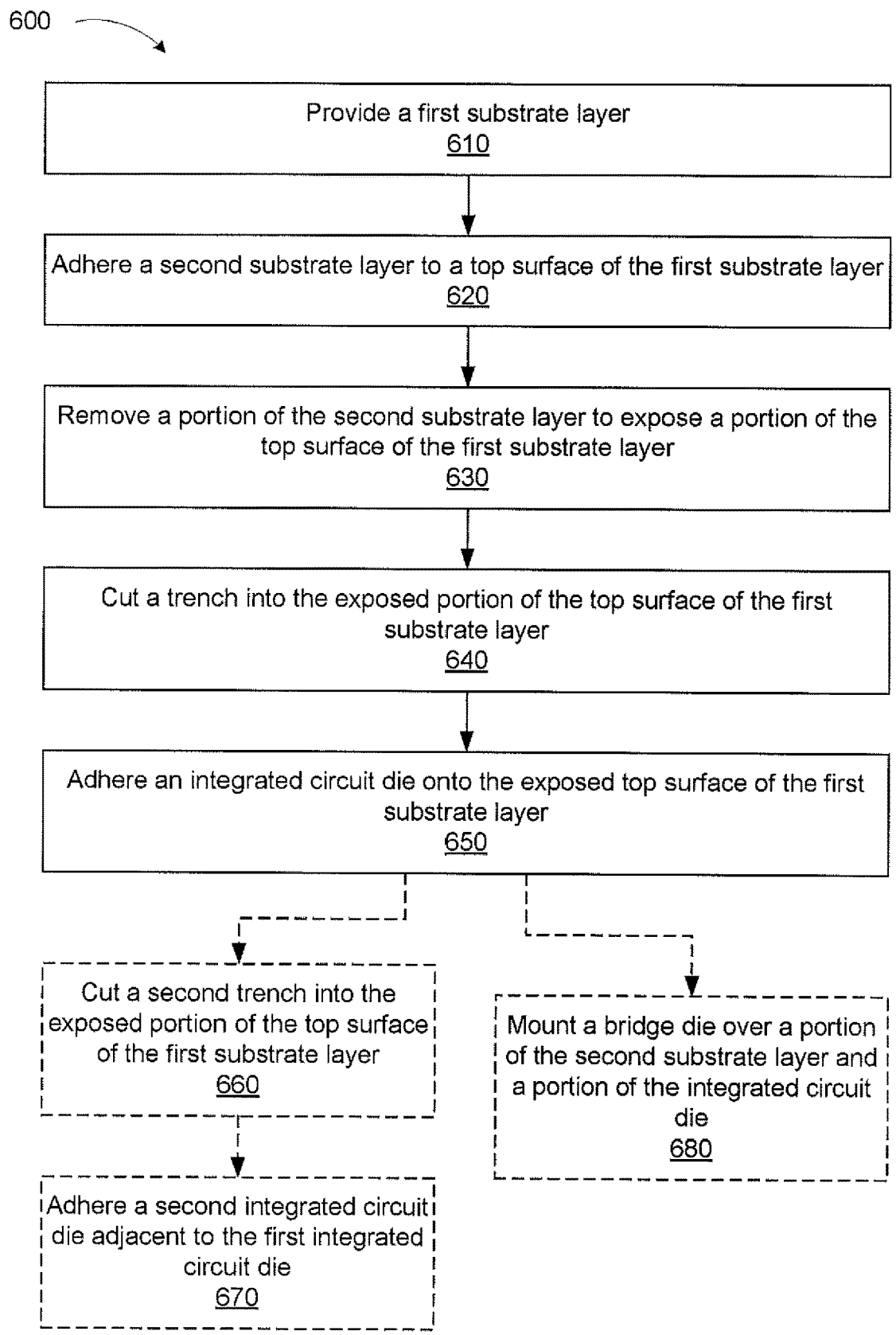
FIG. 6 is a flowchart of an example method of fabricating an integrated device having means for containing liquid adhesive bleed-out, according to an example implementation.

FIG. 6 is a flowchart of an example method 600 of fabricating an integrated device having means for containing liquid adhesive-bleed out, according to an example implementation. The method 600 is suitable for fabricating an integrated device similar to the devices 200, 300, 400, or 500 previously described. The method 600 includes providing a first substrate layer (stage 610). The method 600 includes adhering a second substrate layer to a top surface of the first substrate layer (stage 620). The method 600 includes removing a portion of the second substrate layer to expose a portion of the top surface of the first substrate layer (stage 630). The method 600 includes cutting a trench into the exposed portion of the top surface of the first substrate layer (stage 640). The method 600 includes adhering an integrated circuit die onto the exposed top surface of the first substrate layer (stage 650). In some implementations, the method 600 can optionally include cutting a second trench into the exposed portion of the top surface of the first substrate layer (stage 660) and adhering a second integrated circuit die adjacent to the first integrated circuit die (stage 670). In some implementations, the method 600 can optionally include mounting a bridge die over a portion of the second substrate layer and a portion of the integrated circuit die (stage (680).

The method 600 is suitable for fabricating an integrated device similar to the devices 200, 300, 400, or 500 previously described. The method 600 includes providing a first substrate layer (stage 610). The first substrate layer can be similar to the first substrate layer 220, 420, or 520 previously described.

The method 600 includes adhering a second substrate layer to a top surface of the first substrate layer (stage 620). The second substrate layer can be similar to the second substrate layer 210, 410, or 510 previously described. A bottom surface of the second substrate layer can be adhered to a top surface of the first substrate layer using an adhesive. In some implementations, the adhesive can include an organic compound.

The method 600 includes removing a portion of the second substrate layer to expose a portion of the top surface of the first substrate layer (stage 630). A portion of the second substrate layer can be cut and removed to expose a portion of the top surface of the first substrate layer. The cut can be made with a laser, blade, bit, mill, or chemical process. Removal of the portion of the second substrate layer can form a cavity defined on the side by an edge of the second substrate layer exposed by the cut, and on the bottom by the exposed top surface of the first substrate layer. The cavity can be similar to the cavities 230, 430, or 530 previously described. In some cases, particularly in a high-volume manufacturing process, the cutting process may leave behind a residue or debris of either the substrate material or the adhesive. The debris can take the form of a burr consisting of burned or scorched material. If not remove, the burr may interfere with subsequent fabrication stages, such as placement of an integrated circuit die or other components within the cavity.

The method 600 includes cutting a trench into the exposed portion of the top surface of the first substrate layer (stage 640). The trench can be similar to the trenches 260, 360, 460, or 560 previously described. The trench can be cut with a laser, blade, bit, mill, or chemical process. The process for cutting the trench can be similar to the process for cutting the second substrate layer to create the cavity. In some cases, the cutting process may remove any burrs or other debris remaining from the second substrate layer cutting process. In some cases, the trench can receive any burrs or debris remaining from the second substrate layer cutting process, and prevent them from mechanically interfering with placing components in the cavity in subsequent fabrication steps.

The method 600 includes adhering an integrated circuit die onto the exposed top surface of the first substrate layer (stage 650). The integrated circuit die can be similar to the integrated circuit dies 240, 440, or 540 previously described. The integrated circuit die is adhered with a liquid adhesive, such as an epoxy. In some cases, particularly in a high-volume manufacturing process, excess liquid adhesive may be applied. The excess liquid adhesive may squeeze out from the region between the integrated circuit die and the exposed top surface of the first substrate layer. The liquid adhesive may form a fillet, bulge, or bubble adjacent to the integrated circuit die. Presence of the trench, however, can provide a space for the excess liquid adhesive squeezed out from under the integrated circuit die, and prevent it from fouling the integrated circuit die or the substrate layers, or from extending too far from the integrated circuit die and interfering with components that need to be placed adjacent to the integrated circuit die. In addition, any burrs left on the exposed top surface of the first substrate layer may be pushed into the trench by the integrated circuit die and/or the liquid adhesive squeezed out from under the integrated circuit die. The trench can therefore prevent the burr from interfering with proper positioning of the integrated circuit die.

In some implementations, the method 600 can optionally include cutting a second trench into the exposed portion of the top surface of the first substrate layer (stage 660) and adhering a second integrated circuit die adjacent to the first integrated circuit die (stage 670). In some cases, additional trenches can be cut into the first substrate layer to prevent excess liquid adhesive under the integrated circuit die from interfering with the placement of a second integrated circuit die. In some implementations, a second trench can be positioned at least partially between the first integrated circuit die and the second integrated circuit die. In some implementations, the trench can span or straddle one or both of the perimeters of the integrated circuit dies.

In some implementations, the method 600 can optionally include mounting a bridge die over a portion of the second substrate layer and a portion of the integrated circuit die (stage (680). The bridge die can be similar to the bridge dies 350, 450, or 550. The bridge die can include solder balls for electrically and mechanically coupling the bridge die to the second substrate layer and the integrated circuit die. The trench can prevent a burr and/or liquid adhesive bleed-out from interfering with the position of the integrated circuit die and/or the bridge die, or from fouling surfaces needed for contact or interface between the bridge die and the second substrate or integrated circuit die.

A person of skill in the art will understand that the stages of the method 600 can be performed in different orders without departing from the scope of the invention. In addition, the method 600 can include more or fewer steps without departing from the scope of the invention.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A method of fabricating a device, the method comprising:
    providing a first substrate layer having a top surface and a bottom surface;
    adhering a bottom surface of a second substrate layer to the top surface of the first substrate layer;
    removing a portion of the second substrate layer to expose a portion of the top surface of the first substrate layer;
    cutting a trench into the exposed portion of the top surface of the first substrate layer;
    adhering an integrated circuit die onto the exposed top surface of the first substrate layer with a liquid adhesive such that the trench receives bleed-out of the liquid adhesive from between the integrated circuit die and the top surface of the first substrate layer.

2. The method of claim 1, wherein the trench is defined between the edge of the cavity and a perimeter of the integrated circuit die.

3. The method of claim 1, wherein the trench is defined between the edge of the cavity and a region under the integrated circuit die.

4. The method of claim 1, wherein the trench is a first trench defined between the edge of the cavity and a first side of the integrated circuit die, the method comprising:
    cutting a second trench into the exposed portion of the top surface of the first substrate layer adjacent to a second side of the integrated circuit die.

5. The method of claim 4, wherein the second trench extends from a region under the integrated circuit die to a region outside of a perimeter of the integrated circuit die.

6. The method of claim 4, wherein the integrated circuit die is a first integrated circuit die, the method comprising:
    adhering a second integrated circuit to the exposed portion of the top surface of the first substrate layer adjacent to the first integrated circuit die such that the second trench is positioned at least partially between the first integrated circuit die and the second integrated circuit die.

7. The method of claim 6, wherein the second trench extends from a region under the first integrated circuit die and a region the second integrated circuit die.

8. The method of claim 1, comprising:
    mounting a bridge die over a portion of the second substrate layer and a portion of the integrated circuit die, wherein at least a first solder ball of the bridge die electrically and mechanically couples the bridge die to a top surface of the second substrate layer and at least a second solder ball of the bridge die electrically and mechanically couples the bridge die to a top surface of the integrated circuit die.

9. The method of claim 1, wherein removing the portion of the second substrate layer to expose the portion of the top surface of the first substrate layer comprised cutting the second substrate layer with a laser and removing a portion of the second substrate layer to expose the second portion of the top surface of the first substrate layer.

10. The method of claim 1, wherein the liquid adhesive is an epoxy.

* * * * *